United States Patent [19]
Lin

[11] Patent Number: 5,933,739
[45] Date of Patent: Aug. 3, 1999

[54] SELF-ALIGNED SILICIDATION STRUCTURE AND METHOD OF FORMATION THEREOF

[75] Inventor: Xi-Wei Lin, Fremont, Calif.

[73] Assignee: VLSI Technology, Inc., San Jose, Calif.

[21] Appl. No.: 08/927,479

[22] Filed: Sep. 11, 1997

[51] Int. Cl.$^6$ .................................................. H01L 21/336
[52] U.S. Cl. .................... 438/301; 438/683; 438/738; 438/756; 438/757
[58] Field of Search .................................. 438/683, 738, 438/756, 757

[56] References Cited

U.S. PATENT DOCUMENTS

| | | |
|---|---|---|
| 4,984,055 | 1/1991 | Okumura et al. . |
| 5,200,808 | 4/1993 | Koyama et al. . |
| 5,554,565 | 9/1996 | Liaw et al. . |
| 5,661,084 | 8/1997 | Kuo et al. . |
| 5,814,553 | 9/1998 | Chuang et al. . |

OTHER PUBLICATIONS

Hummel, Rolf E., Electronic Properties of Materials, Srpinger–Velag, p. 143, 1993.

*Primary Examiner*—John F. Niebling
*Assistant Examiner*—Jonathan Hack
*Attorney, Agent, or Firm*—Burns, Doane, Swecker & Mathis, LLP

[57] ABSTRACT

The invention relates to integrated circuits and to methods of forming self-aligned silicidation structures. In an exemplary embodiment, a first insulating layer is formed on the surface of a semiconductor substrate which includes an electrode. A second insulating layer is formed over the first insulating layer and a photoresist pattern is formed over a silicide exclusion area. Exposed portions of the first and second insulating layers are removed by one or more etching steps, wherein an etchant used to remove the exposed portions of the second insulating layer has a higher selectivity for the second insulating layer than for the first insulating layer. A silicide layer can then be formed over the surface of the semiconductor substrate except for silicide exclusion areas. Modification of the profiles of features underlying the first insulating layer, such as sidewall spacer and field oxides can thereby be prevented.

11 Claims, 2 Drawing Sheets

SELF-ALIGNED SILICIDATION STRUCTURE AND METHOD OF FORMATION THEREOF

BACKGROUND OF THE INVENTION

1. Field of the Invention

The present invention relates generally to integrated circuits and to self-aligned silicidation structures used in fabricating integrated circuits. More particularly, the invention relates to self-aligned silicidation structures which include a first and second insulating layer and to methods of forming such self-aligned silicidation structures.

2. State of the Art

In a self-aligned silicidation (SALICIDE) process, it is often necessary to exclude the formation of silicides on specific regions of the silicon substrate in order to maintain a sufficient level of resistance. For example, it is desirable to prevent silicide formation on electrostatic discharge (ESD) diffusion areas of the device.

FIGS. 1(a)–(d) illustrates a process flow for forming a silicidation exclusion area according to a conventional process. As shown in FIG. 1(a), a semiconductor substrate 100 includes a polysilicon gate structure which includes polysilicon gate 102, gate oxide 104 and sidewall spacers 106. With reference to FIG. 1(b), an oxide layer 108 is first deposited across the semiconductor substrate 100. As illustrated in FIG. 1(c), photolithographic patterning is performed by photoresist coating, exposure and development steps, resulting in photoresist mask 110. Oxide layer 108 is then wet etched using a hydrofluoric acid (HF) solution or is anisotropically dry etched, as shown in FIG. 1(d). The post-etched oxide covers only those areas of the device on which the formation of silicide is to be prevented, i.e., the silicide exclusion region 112. The remaining oxide prevents reaction between metal and silicon in the subsequent SALICIDE process.

In the above-described process, it is critical that the deposited oxide be of sufficient thickness such that it is not entirely consumed during reaction with the metal. For if the oxide layer is totally consumed, interaction between the metal and underlying silicon will undesirably and necessarily result in silicide formation on the silicide exclusion area.

Under conditions typical for a titanium-based SALICIDE process, the silicide-exclusion oxide 108 must have a minimum thickness of about 500 Å to prevent the entire consumption thereof. As shown in FIG. 1(d), while the oxide layer 108 may not be entirely consumed, both the shape and width of the sidewall spacers (dashed line is pre-etched spacer) and field oxides (not shown) in the unmasked areas may be altered during the HF wet etching or anisotropic dry etching step. In addition undercutting of the oxide beneath photoresist mask 110 may occur.

The features underlying oxide layer 108 are particularly susceptible to profile alteration when the oxide layer is thick, since the process requires a significant amount of overetch to clear the silicon areas requiring silicidation. Such modification of the underlying features, such as the spacer and field oxides, is particularly disadvantageous. Any change in the integrity thereof can adversely impact the device characteristics in addition to the subsequent SALICIDE process. Consequently, device yield can be significantly lowered if such modifications in feature profiles occur.

SUMMARY OF THE INVENTION

In accordance with exemplary embodiments of the present invention, a method of forming a self-aligned silicidation structure is provided. According to the method, a first insulating layer is formed on the surface of a semiconductor substrate, which substrate comprises an electrode. A second insulating layer is formed over the first insulating layer, and a photoresist pattern is formed over a silicide exclusion area. As used herein, the term "exclusion area" refers to a portion of the device being formed upon which the prevention of deposition or formation of a specific film is desired, while at the same time that film is to be deposited or formed on other areas of the device.

Exposed portions of the first and second insulating layers are removed by one or more etching steps. The etchant used to remove the exposed portions of the second insulating layer has a higher selectivity for the second insulating layer than for the first insulating layer. As a result, substantially all of the second insulating layer can effectively be removed prior to removal of the first insulating layer.

The nature of the first insulating layer is such that it allows for good controllability of the oxide etch. It can be removed without adversely affecting the profile of underlying features, such as sidewall spacers and field oxides. Consequently, the integrity of both the spacer and field oxide profiles in the unmasked areas is effectively protected. A silicide layer can therefore be formed over the surface of the semiconductor substrate with silicide formation effectively being prevented on the silicide exclusion area, while avoiding the problems associated with the state of the art. Semiconductor devices can thus be fabricated which are immune or less susceptible to shifts in device characteristics and resultant product yield losses due to overetching.

BRIEF DESCRIPTION OF THE DRAWINGS

These and other advantages and objects of the invention will become more apparent from the following detailed description of preferred embodiments when read in conjunction with the attached figures, in which.

DETAILED DESCRIPTION OF THE PREFERRED EMBODIMENTS

The methods according to the invention are applicable to the manufacture of semiconductor devices, which devices require an exclusion area during formation thereof. The above-described problems associated with the state of the art have been overcome by the use of a silicide exclusion structure including a plurality of insulating layers. In an exemplary embodiment of the invention, a bilayer structure can be employed. In particular, the silicide exclusion structure comprises a first insulating layer and a second insulating layer formed over the first insulating layer.

Figure 1:
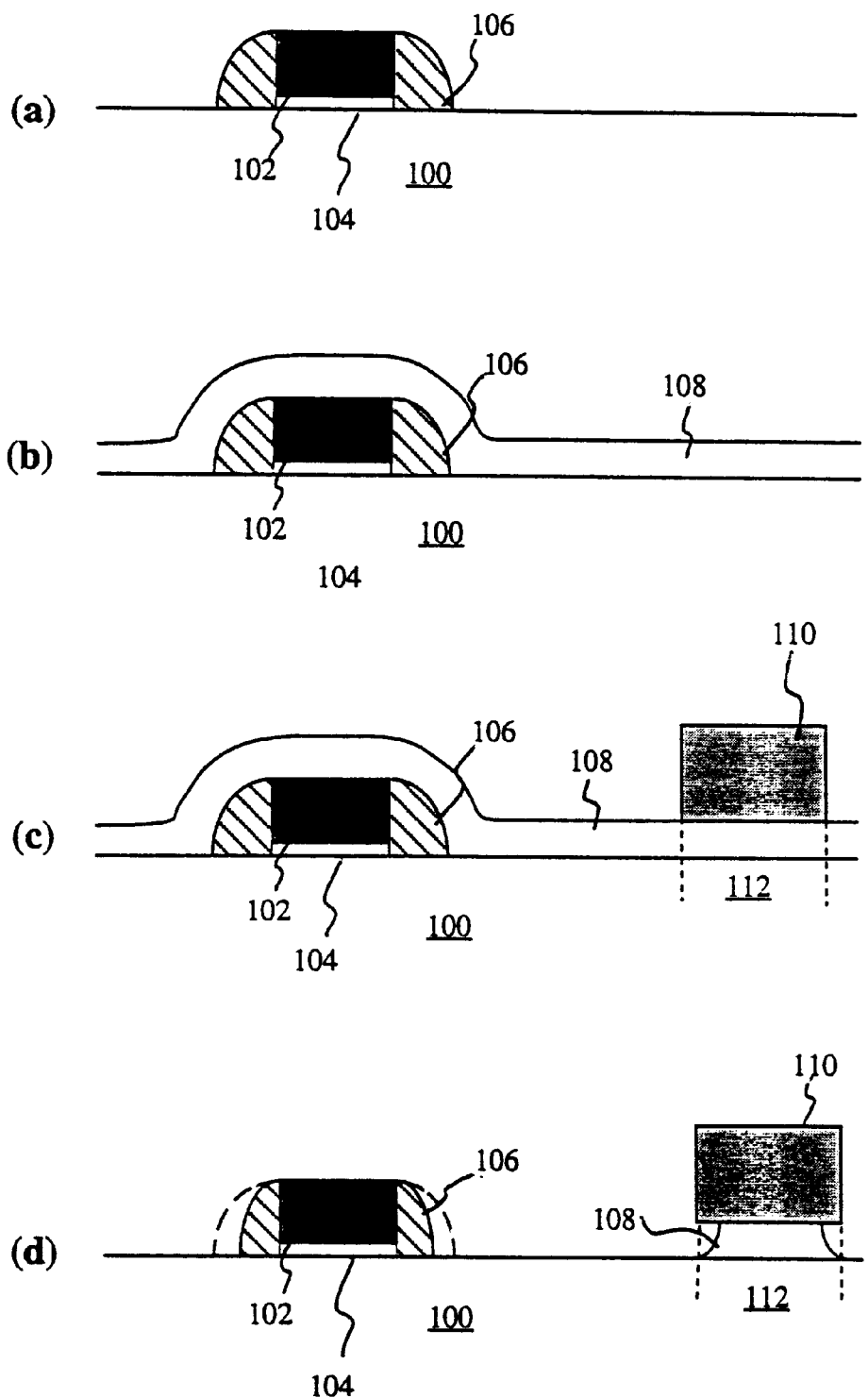
FIGS. 1(a)–(d) are cross-sectional views of a SALICIDE structure formed according to a conventional process.
Figure 2:
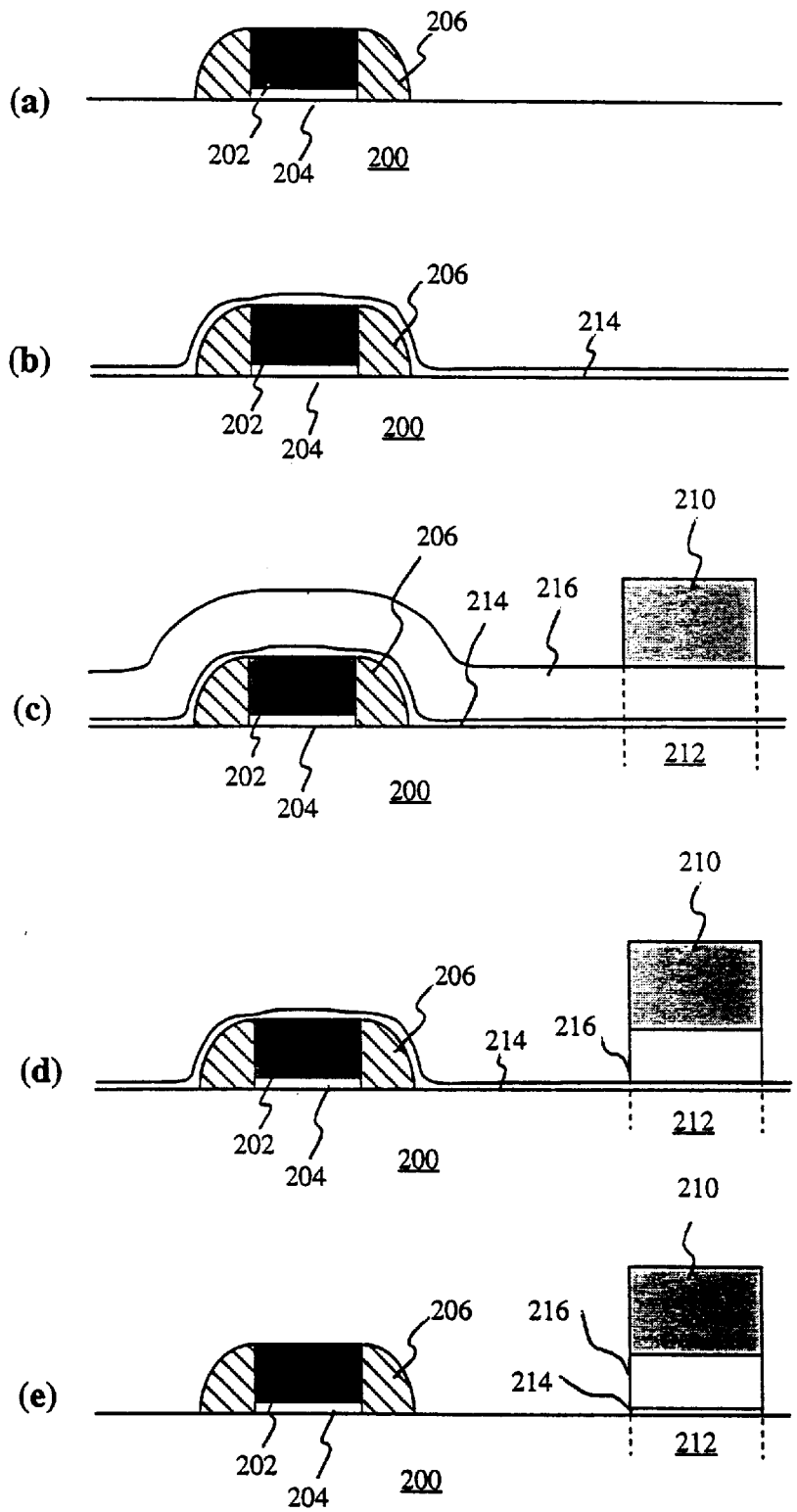
FIGS. 2(a)–(e) are cross-sectional views of a SALICIDE structure formed in accordance with the invention.

The usefulness of the inventive method lies in the fact that the selectivities, and hence the relative etch rates of the first and second insulating layers differ significantly. As shown in FIGS. 2(a) and (b), a first insulating layer 214 is formed over the semiconductor substrate 200, the surface of which includes a gate electrode structure which includes gate 202, gate oxide 204 and sidewall spacers 206.

A variety of insulating film types deposited by well known techniques can be used for the first insulating layer 214. The first insulating layer 214 should provide good controllability during etching to effectively protect the integrity of both the spacer and field oxides in the unmasked areas of the device. The first insulating layer should therefore have a significantly lower selectivity than the second insulating layer in the etching medium employed to remove unexposed portions of the second insulating layer.

Thus, the first insulating layer should be a layer which provides a relatively lower etch rate than the second insulating film. Densified layer can be deposited as such (i.e., an as deposited layer) or, alternatively, a non-dense layer can be densified in a process subsequent to the deposition step. The use of a single step deposition however, allows for a reduced number of processing steps compared to the use of a subsequent densification step. Productivity can thereby be increased.

Suitable as deposited densified films which can be used for the first insulating layer include, for example, thermally grown silicon dioxide ($SiO_2$) films. As deposited films other than thermal oxides can also be used as the first insulting layer. Exemplary such films include LPCVD or PECVD silicon nitride and silicon oxynitride layers. Such layers provide a particularly effective etch stop when used in combination with an oxide layer as the second insulating layer. If either silicon nitride or oxynitride films are used, a subsequent densification step is unnecessary.

In the event the first layer is a silicon oxide film deposited by LPCVD or PECVD, the layer should be densified in a subsequent thermal process. Suitable such films include, for example, TEOS (tetraethylorthosilicate) oxides deposited by low pressure chemical vapor deposition (LPCVD) or by plasma enhanced chemical vapor deposition (PECVD).

The densification subsequent to film deposition can be achieved by high temperature processing (i.e., annealing or sintering) in a rapid thermal processing (RTP) system or in a diffusion furnace. In either situation, the heat treatment is preferably conducted in an inert gas atmosphere, such as nitrogen, argon or helium.

The temperature during the heat treatment step should be selected with care, since high temperatures can affect the dopant profiles within the substrate silicon. As a result, if sufficiently high temperatures are used during the densification step, the device characteristics can be adversely impacted. Therefore, to incorporate the present method into existing semiconductor processes, a heat treatment temperature in the range of from about 750 to 850° C., and more specifically from about 800 to 850° C. can be used. A typical temperature for densification of an oxide layer is about 850° C.

If it is desired to use a temperature in excess of 850° C. during the densification step, such temperature should be taken into account in the overall process design since the effects of dopant diffusion can be significant. If the densification temperature is taken into account in the process design, a temperature in the range of from about 700 to 1100° C. can be used, more specifically from about 800 to 1050° C., with a temperature of about 1000° C. being typical.

It has been found that the etching rate of the first insulating layer can be further decreased below the thermally treated value by use of an ion implantation step prior to the heat treatment. The following example is illustrative of the effects of ion implantation and heat treatment steps on the etching rate of the first insulating layer.

EXAMPLE

Silicon test wafers were prepared by depositing thereon 200 Å of LPCVD TEOS oxide at 650° C. The coated wafers were divided into three groups. Ion implantation was performed on one of the groups of wafers using $BF_2^+$ at a dose of 3E15 $cm^{-2}$ and 50 keV, and with $As^+$ at 3E15 $cm^{-2}$ and 60 keV in a second group. The third group of wafers was not implanted.

Each of the three groups of wafers was then divided into two subgroups; the first subgroup of each group was annealed at 850° C. for 40 minutes, while the second subgroup was not annealed. All of the wafers were then etched in a 50:1 $H_2O$ to HF solution at 24° C. for etch rate determination. The results of the experiment are shown in the table below.

TABLE

| TEOS Etch Rate in 50:1 $H_2O$:HF | | |
|---|---|---|
| | Annealed (Å/sec) | Unannealed (Å/sec) |
| Unimplanted | 3.8 | 8.5 |
| $As^+$ implanted | 2.12 | 6.27 |
| $BF_2^+$ implanted | 1.67 | 8.60 |

As can be seen from the table, the as-deposited unimplanted TEOS oxide wafer exhibited an etch rate of 8.5 Å/sec in the 50:1 $H_2O$:HF etchant solution. However, the etch rate after densification decreased considerably to 3.8 Å/sec. The annealed implanted wafers exhibited even lower etch rates than the unimplanted densified samples.

Based on the foregoing results, the use of ion implantation to lower the etching rate of the first insulating layer is particularly advantageous. This is especially so since arsenic and boron implantation steps are already present in the process flows of most devices for source-drain formation. Such implants can, therefore, also serve as the first insulating layer implantation step. In addition to integration of the implantation steps, the high temperature annealing step used to activate the source-drain regions can also serve as the high temperature densification step for the first insulating layer.

In addition to the first insulating layer material used, the thickness of that layer should be considered to prevent the etching of the underlying features of the device. While appropriate layer thicknesses are dependent upon the specific layer deposited and its etching rate, the first insulating layer is preferably kept thin. Use of a relatively thin layer provides several advantages. For example, the etching of underlying features of the device, such as spacer and field oxides, can be prevented. Furthermore, with a relatively thin layer, the etching process is not excessively prolonged since less material is being removed. That is, the time to clear the unmasked (i.e., non-exclusion) areas is minimized. If a thin oxide is not used, the global oxide etch uniformity would become degraded, and any benefit gained from the bilayer structure would not be realized.

Thicknesses for the first insulating layer can be, for example, from about 20 to 300 Å, more specifically, from about 50 to 150 Å, with about 100 Å being typical. If the first insulating layer is highly selective with respect to the underlying features, a relatively thin layer can be used. Thus, in preventing the etching of underlying spacer and field oxides, a first insulating layer silicon nitride can be thinner than an oxide.

Because the etch rate of the second insulating layer is high relative to the first layer, the thickness of the first layer should be selected carefully so as to minimize the extent of etch undercutting along the edges of the mask. Such problem can effectively be eliminated by a reduction in the thickness of the first insulating layer, thereby shortening the total etch time. Furthermore, in the case of a SALICIDE exclusion area, if any oxide non-uniformity develops at the end of the second insulating layer etch, a thin, densified first layer ensures that any residual surface insulating material left on any silicon areas is also thin and can be subsequently reduced by the metal during the SALICIDE process. In other words, the use of a thin first insulating layer ensures the formation of the metal silicide in all unmasked areas.

After formation of the first insulating layer 214, a second insulating layer 216 is formed over the first layer. The purpose of the second insulating layer is to maintain the silicide exclusion function in the subsequently masked areas. As shown in the exemplary embodiment of FIG. 2(c), second layer 216 can be formed directly on the first layer 214.

To maximize the effectiveness of the present methods, it is particularly advantageous that the selectivity ratio of the second insulating layer to the first insulating layer be high. In this respect, a ratio of about 3:1 has been found to be very effective. If, however, the etching rate of the second insulating layer is too high, undercutting beneath the photomask will undesirably result.

Exemplary materials which can be used as the second insulating layer 216 include doped and undoped silicon oxides, and spin-on-glass (SOG). The second layer should be sufficiently thick to protect the masked areas from silicidation. On the other hand, the oxide thickness should not be overly thick or else etch undercutting may result along the mask edges.

While suitable thicknesses for the second insulating layer will depend upon the material thereof, a thickness of from about 300 to 2000 Å, more particularly from about 500 to 1000 Å is typical. Higher etching rate materials should generally be deposited with a smaller thickness to minimize the consequences of etch undercutting.

Referring to FIG. 2(c), following formation of the second insulating layer 216, the semiconductor substrate 200 is next patterned by standard photolithographic techniques. The resulting photoresist mask 210 covers the second insulating layer 216 over the silicide exclusion area 212.

The second and first insulating layers 216, 214 are next etched in that order using conventional etching techniques which depend upon the specific materials of those layers. For example, an HF solution can be used for etching an oxide layer. Depending upon the type of oxide being etched and the desired etching rate, the HF solution can have a concentration of from about 10:1 to 300:1, more specifically from about 50:1 to 200:1, with 100:1 being exemplary. In the case a silicon nitride layer is used as the first insulating layer, a phosphoric acid ($H_3PO_4$) solution or a mixture of phosphoric acid with hydrogen peroxide can be used. Alternatively, dry etching processes can be used to remove the first and/or second insulating layers.

It can be beneficial to select materials for the first and second insulating layers which can be etched using a single etchant. In this way, separate etching steps for the first and second insulating layers can be integrated into a single step. For example, use of a bilayer oxide structure in which silicon oxide layers having different etching characteristics can be particularly advantageous. In accordance with an exemplary embodiment of the invention, a bilayer oxide structure is used which includes a thin densified oxide layer as the first insulating layer and a thick non-densified oxide layer as the second insulating layer.

Because of the large difference in etch rates between the first and second insulating layers, the etching step (e.g., an HF wet etch for oxide removal) proceeds by rapid removal of the second insulating layer. When the first insulating layer 214 is reached, the etch rate abruptly decreases due to the low selectivity of the etchant to the first layer. This decrease in etch rate provides two benefits. First, it allows for total removal of the first insulating layer from across the substrate before the sidewall spacer oxide 206 and the field oxide are reached. Consequently, the global etch uniformity across the substrate can be significantly improved. Second, as the etch proceeds to remove the first insulating layer 214, whether it be with the same etchant or a different etchant, the slow removal rate due to the lower etch rate of the first insulating layer 214 provides increased controllability to the etch process. This preserves the integrity of the underlying spacer and field oxides.

It will be appreciated by those skilled in the art that the present invention can be embodied in other specific forms without departing from the spirit or essential character thereof. For example, while the foregoing description pertains specifically to the prevention of silicide formation, the inventive method can equally be applied to the formation of exclusion areas not relating to silicidation structures. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of forming a self-aligned silicidation structure, comprising the steps of:
    (a) forming a first insulating layer on the surface of a semiconductor substrate, the semiconductor substrate comprising an electrode;
    (b) forming a second insulating layer over the first insulating layer;
    (c) forming a photoresist pattern over a portion of said second insulating layer to define silicide exclusion area;
    (d) removing exposed portions of the first and second insulating layers by one or more etching steps, wherein an etchant used to remove the exposed portions of the second insulating layer has a higher selectivity for the second insulating layer than for the first insulating layer; and
    (e) forming a silicide layer over the surface of the semiconductor substrate to form said self-aligned silicidation structure.

2. The method according to claim 1, wherein the first insulating layer is silicon nitride or silicon oxynitride.

3. The method according to claim 1, wherein the first insulating layer is a silicon oxide.

4. The method according to claim 3, wherein the first insulating layer is formed by depositing and subsequently densifying an insulating layer prior to formation of the second insulating layer.

5. The method according to claim 1, wherein the first insulating layer is a thermally grown silicon dioxide or a CVD silicon oxide formed from TEOS.

6. The method according to claim 1, wherein the first insulating layer has a thickness of from about 20 to 300 Å.

7. The method according to claim 1, wherein the second insulating layer is a doped or undoped silicon oxide or spin-on-glass.

8. The method according to claim 7, wherein the second insulating layer is a CVD silicon oxide formed from TEOS.

9. The method according to claim 8, wherein the second insulating layer has a thickness of from about 300 to 2000 Å.

10. The method according to claim 8, wherein the second insulating layer is formed on the first insulating layer.

11. A method of forming a self-aligned silicidation structure, comprising the steps of:

(a) forming a first silicon oxide layer on the surface of a semiconductor substrate, the semiconductor substrate comprising an electrode;

(b) forming a second silicon oxide layer on the first silicon oxide layer;

(c) forming a photoresist pattern over a portion of said second insulating layer to define silicide exclusion area;

(d) removing exposed portions of the first and second silicon oxide layers in the same or different HF-based etching solutions, wherein the etching rate of the second silicon oxide layer is greater than the etching rate of the first silicon oxide layer in the HF-based solution used to remove the exposed portions of the second silicon oxide layer; and (e) forming a silicide layer over the surface of the semiconductor substrate to form said self-aligned silicidation structure.

* * * * *